(12) United States Patent
Song et al.

(10) Patent No.: US 9,425,245 B2
(45) Date of Patent: Aug. 23, 2016

(54) ARRAY SUBSTRATE AND METHOD FOR MANUFACTURING THE SAME, DISPLAY DEVICE

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/101,735

(22) Filed: Dec. 10, 2013

(65) Prior Publication Data

US 2014/0159012 A1      Jun. 12, 2014

(30) Foreign Application Priority Data

Dec. 12, 2012 (CN) .......................... 2012 1 0536963

(51) Int. Cl.
*H01L 29/04* (2006.01)
*H01L 29/10* (2006.01)
(Continued)

(52) U.S. Cl.
CPC .......... *H01L 27/3276* (2013.01); *H01L 27/322* (2013.01); *H01L 51/5265* (2013.01); *H01L 51/56* (2013.01); *H01L 27/3244* (2013.01); *H01L 51/5271* (2013.01); *H01L 2227/323* (2013.01)

(58) Field of Classification Search
CPC . H01L 51/0545; H01L 27/1214; H01L 27/12; H01L 33/0079; B82Y 10/00
USPC ................ 257/40, 59; 438/22, 28, 29, 34; 313/504, 506
See application file for complete search history.

(56) References Cited

U.S. PATENT DOCUMENTS 8,883,531 B2 * 11/2014 Kim .................... H01L 27/3244
257/91
2005/0140277 A1 * 6/2005 Suzuki et al. ................. 313/504
(Continued)

FOREIGN PATENT DOCUMENTS

CN        102629621 A      8/2012
JP        2010010020 A     1/2010
(Continued)

OTHER PUBLICATIONS

English abstract of JP 2010287543A, listed above, 2 pages.
(Continued)

*Primary Examiner* — Lex Malsawma
*Assistant Examiner* — Eric Jones
(74) *Attorney, Agent, or Firm* — Ladas & Parry LLP

(57) ABSTRACT

Embodiments of the present invention disclose an array substrate comprising a plurality of pixel units disposed on a base substrate, the pixel units comprising: a thin film transistor structure formed on the base substrate; and an OLED driven by the thin film transistor structure, the OLED disposed in a pixel region of the pixel units, the OLED comprising sequentially in a direction away from the base substrate a first electrode which is transparent, a light-emitting layer and a second electrode which reflects light; a transflective layer disposed between the OLED and the thin film transistor structure; a color filter disposed between the second electrode of the OLED and the transflective layer; the second electrode of the OLED and the transflective layer constitute a microcavity structure.

18 Claims, 4 Drawing Sheets

(51) Int. Cl.
  *H01L 31/00*  (2006.01)
  *H01L 27/32*  (2006.01)
  *H01L 51/52*  (2006.01)
  *H01L 51/56*  (2006.01)

(56) References Cited

U.S. PATENT DOCUMENTS

2006/0152151 A1* 7/2006 Seo .................. H01L 27/322
                                              313/506
2006/0232195 A1* 10/2006 Cok et al. ............... 313/504
2009/0021676 A1* 1/2009 Kuo et al. ............... 349/114
2009/0251051 A1* 10/2009 Hwang ............ H01L 27/3213
                                              313/504
2009/0261716 A1  10/2009 Choi et al.
2010/0001637 A1   1/2010 Satou
2010/0090594 A1*  4/2010 Choi et al. ............... 313/506

FOREIGN PATENT DOCUMENTS

JP      2010-117398 A    5/2010
JP      2010287543 A    12/2010

OTHER PUBLICATIONS

English abstract of JP 2010010020A, listed above, 2 pages.

Extended European search report issued on Mar. 7, 2014 by the European Patent Office for international application No. 13196856.2, 51 pages.
Second Office Action for Chinese Patent Application No. 201210536963.4 dated Mar. 25, 2015; four (4) pages.
English translation of Second Office Action for Chinese Patent Application No. 201210536963.4 dated Mar. 25, 2015; three (3) pages.
Extended European search report issued on Mar. 7, 2014 by the European Patent Office for international application No. 13196858.8, fifty-one (51) pages.
Office Action for U.S. Appl. No. 14/103,617 dated Jan. 29, 2015; thirty-two (32) pages.
First Office Action for Chinese Patent Application No. 201210537767.9 dated Apr. 28, 2014; four (4) pages.
English translation of First Office Action for Chinese Patent Application No. 201210537767.9 dated Mar. 25, 2015; three (3) pages.
Second Office Action for Chinese Patent Application No. 201210537767.9 dated Nov. 14, 2014; five (5) pages.
English translation of Second Office Action for Chinese Patent Application No. 201210537767.9 dated Nov. 14, 2014; four (4) pages.
Chinese Rejection Decision dated Apr. 23, 2015; Appln. No. 201210537767.9.
First Chinese Office Action Appl. No. 201210536963.4; Dated Oct. 31, 2014.

* cited by examiner

ARRAY SUBSTRATE AND METHOD FOR MANUFACTURING THE SAME, DISPLAY DEVICE

CROSS REFERENCE TO RELATED APPLICATIONS

This application claims priority from Chinese National Application No. 201210536963.4 filed on Dec. 12, 2012, the contents of which are incorporated herein by reference.

TECHNICAL FIELD

Embodiments of the present invention relate to the field of display technology, particularly to an array substrate, a method for manufacturing the same, and a display device comprising the array substrate.

BACKGROUND

Organic Light-Emitting Diodes (OLED) is considered as one of the most important display technologies in the future for its advantages in simple manufacturing process, low cost, the arbitrarily adjustable color of its emitting light in region of visible light, suitable for manufacturing a large size display device and the flexible and the like. Especially the white OLED (WOLED) has a power efficiency over 60 lm/W and a lifetime more than 20,000 hours, greatly promoting development of the WOLED.

As illustrated in FIG. 1(a), a WOLED employs an organic light-emitting layer 102, the material of which is made up by mixing materials capable of emitting three primary colors of red, green and blue, so that the organic light-emitting layer 102 emits white light. The organic light-emitting layer 102 is disposed between a cathode 101 and an anode 103 so that the white light emitted by the organic light-emitting layer is reflected by the cathode 101 and then exit from a side of the anode 103. In order to improve transmittance and enhance brightness of the WOLED display device, a transflective layer 103' is disposed at one side of the anode corresponding to a region of a color filter of every color to form a microcavity structure, as shown in FIG. 1(b). The microcavity structure refers to a structure formed between a reflective layer and a transflective layer with a thickness of microns order and the principle of the microcavity structure to increase light intensity is: light rays can be continuously reflected between layers, and due to resonance effect, in light finally coming out of the transflective layer, light with a specific wavelength will be intensified, and the wavelength of light intensified is related to the thickness of the microcavity. In a WOLED display device, different pixel units are used for emitting different colors of light, and thus microcavities in different pixel units should be able to intensify light of different wavelengths (the color being same as the one of the color filter corresponding to the microcavity), that is to say, microcavities of different pixel units have different thicknesses.

FIGS. 2 and 3 show diagrams of layer structures of two conventional WOLED array substrates. The color filter is located outside the microcavity structure. Based on the principle mentioned above, microcavity structures corresponding to color filters of every color have different thicknesses, such as as the structure 300 in FIG. 2 and the structure 400 in FIG. 3. As lights with different colors have different wavelengths, the corresponding microcavity structures are not the same and have different thicknesses. For example, as shown in FIG. 3, Cathode is the cathode of the OLED, Anode is the anode of the OLED and an organic light emitting layer is disposed (the material thereof generally formed by mixing organic materials capable of emitting three primary colors RGB). R, G, B and W represent light exiting regions of red light, green light, blue light and white light respectively. Red CF, Green CF and Blue CF are color filters of red light, green light and blue light respectively. Microcavity structure of each color light comprises IZO layer or ITO layer disposed above OC layer (protective layer), further comprises a SiNx and SiOx (silicon nitride and silicon oxide) layer for R region, G region and B region, and further comprises an IZO/ITO layer in addition to the anode for R region and B region, with transmittance of corresponding color light increased after white light emitted by WOLED passes through the layers mentioned above. As shown in FIG. 4, the spot lines correspond to transmittance (i.e. brightness) without microcavity structure, and solid lines correspond to transmittance with microcavity structure. Transmittance of blue light is about 1.6 times that of original value, transmittance of green light is about 2.5 times that of original value and transmittance of red light is about 2.2 times that of original value.

As can be seen from FIGS. 2 and 3, the existing microcavity structure increases light transmittance, however, layer structure of the existing microcavity structure is complicated and it is required to manufacture microcavity structures with different thicknesses for regions corresponding to color filters of each color so that the manufacturing process is complicated.

SUMMARY

Technical problem to be solved by embodiments of the present invention is how to manufacture a microcavity structure with simple manufacturing process and increase transmittance of a WOLED display device.

To solve the above technical problem, embodiments of the present invention provide an array substrate comprising a base substrate and a plurality of pixel units disposed on the base substrate, each of the pixel units comprising:

a thin film transistor structure formed on the base substrate; and an OLED driven by the thin film transistor structures, the OLED located in the pixel region of the pixel units, the OLED comprising sequentially a first transparent electrode, a light-emitting layer and a second electrode which reflects light, in a direction away from the base substrate;

a transflective layer located between the OLED and the thin film transistor structure;

a color filter located between the second electrode of the OLED and the transflective layer;

wherein the second electrode of the OLED and the transflective layer form a microcavity structure.

In an embodiment of the present invention, the thin film transistor structure includes a first gate and a second gate formed on the base substrate, a gate insulation layer formed on the first gate and the second gate, a first active layer and a second active layer formed on the gate insulation layer, a first source and a first drain formed on the first active layer, a second source and a second drain formed on the second active layer, the first drain being connected to the second gate, the first gate, the gate insulation layer, the first active layer, the first source and the first drain constituting a switching thin film transistor, the second gate, the gate insulation layer, the second active layer, the second source and the second drain constituting a driving thin film transistor;

the second drain of the driving thin film transistor is electrically connected to the first electrode of the OLED.

In an embodiment of the present invention, a passivation layer is also disposed on the thin film transistor structure; the OLED is formed over the passivation layer with the second electrode of the OLED being a cathode and the first electrode being an anode, the anode connected to the second drain through via holes formed in the passivation layer, the transflective layer formed over the passivation layer, the color filters formed over the transflective layer, the color filters of different colors having different thicknesses, both the transflective layer and the color filters located in the pixel region of the pixel units, and the anode of the OLED located above the color filters.

In an embodiment of the present invention, a passivation layer is further formed on the thin film transistor structure; the OLED is formed above the passivation layer with the first electrode of the OLED being a cathode and the second electrode being an anode, the cathode being connected to the second drain through via holes in the passivation layer, the transflective layer formed over the passivation layer, the color filter formed over the transflective layer, and color filters of different colors having different thicknesses, both the transflective layer and the color filters located in the pixel region of the pixel units and the cathode of the OLED located above the color filters.

In an embodiment of the present invention, a resin layer is also disposed between the color filter and the first electrode, the first electrode being connected to the second drain by via holes through the resin layer and the passivation layer.

In an embodiment of the present invention, a pixel define layer is also formed in a corresponding region of the thin film transistor structure of the pixel units and on the first electrode.

In an embodiment of the present invention, the transflective layer is made of any one of silver, aluminum, molybdenum, copper, titanium, chromium and alloys thereof and has a transmittance in a range of 5%-95%.

In an embodiment of the present invention, the transflective layer has a thickness between 10 Å to 200 Å.

In an embodiment of the present invention, the color filters have a thickness in a range of 1000 Å to 40000 Å.

In an embodiment of the present invention, the color filter is a color filter of RGB mode, RGBY mode or RGBW mode.

Embodiments of the present invention also provide a method for making an array substrate, comprising:

forming a patterns of a thin film transistor structure and a passivation layer on a base substrate to define a plurality of pixel units on the base substrate;

forming patterns of a transflective layer and a color filter in pixel region of the pixel unit so that the color filter is disposed above the transflective layer;

forming an OLED in the pixel region of the pixel unit so that the transflective layer and the color filter are located between the OLED and the thin film transistor structure.

In an embodiment of the present invention, forming patterns of the transflective layer and the color filter in the pixel region of the pixel unit comprising:

forming a transflective film on the passivation layer and forming a pattern of the transflective layer in the pixel region through a patterning process;

forming a color filter film of one color on the base substrate formed with the transflective layer, forming a pattern of the color filter in the pixel region through a patterning process and forming patterns of color filters of other colors sequentially in this manner so that patterns of the color filters are formed and the color filters of every color have different thicknesses.

In an embodiment of the present invention, forming an OLED in the pixel region of the pixel unit comprising:

etching via holes in the passivation layer through a patterning process;

forming a transparent conductive film and forming a pattern of the first electrode of the OLED through a patterning process, the first electrode being connected to the thin film transistor structure through the via holes;

forming an insulation film and forming a pattern of the pixel define layer through a patterning process so that position of the OLED to be formed is defined in the pixel region;

forming an organic light-emitting layer;

forming a second electrode of the OLED for reflecting light, thus forming the OLED.

In an embodiment of the present invention, the method also comprises forming a resin layer after forming patterns of the transflective layer and the color filter and before forming the OLED.

In an embodiment of the present invention, forming the OLED in the pixel region of the pixel units comprising:

forming via holes through the resin layer and the passivation layer by a patterning process;

forming a transparent conductive film, and forming a pattern of the first electrode of the OLED by a patterning process, the first electrode being connected to the thin film transistor structure through the via holes;

forming an insulation film, and forming a pattern of the pixel define layer by a patterning process, such that position of the OLED to be formed is defined in the pixel region;

forming an organic light emitting layer;

forming a second electrode of the OLED for reflecting light, thus forming the OLED.

In an embodiment of the present invention, the transflective layer is made of any one of silver, aluminum, molybdenum, copper, titanium, chromium and alloys thereof and has a transmittance in a range of 5% to 95%.

In an embodiment of the present invention, the transflective layer has a thickness in a range of 10 Å to 200 Å.

In an embodiment of the present invention, the color filter has a thickness in a range of 1000 Å to 40000 Å.

Embodiments of the present invention provide a display device comprising the array substrate mentioned above.

Embodiments of the present invention increase transmittance of light by forming a microcavity structure between the transflective layer and the reflective electrode of the OLED (the cathode or the anode). And furthermore, as the color filter is formed on the transflective layer, the color filter is inside the microcavity structure for each pixel unit. As the color filters of pixel units of different colors are formed in different steps, their thickness can be easily controlled respectively. Thus, the array substrate according to embodiments of the present invention is easy to manufacture at a low cost.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
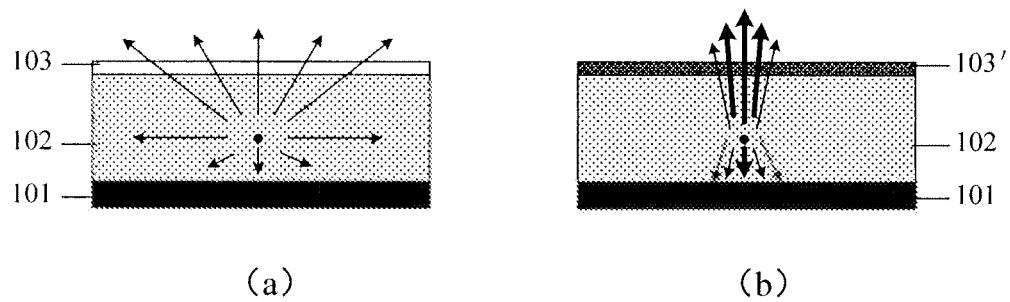
In FIG. 1, (a) is a diagram of an OLED without microcavity structure, (b) is a diagram showing the principle of microcavity structure of conventional technology.
Figure 2:
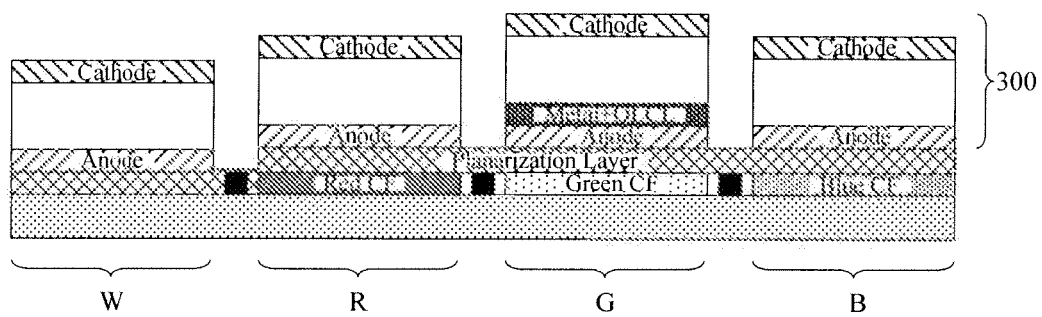
FIG. 2 shows a diagram of a WOLED array substrate structure with microcavity structure of conventional technology.
Figure 3:
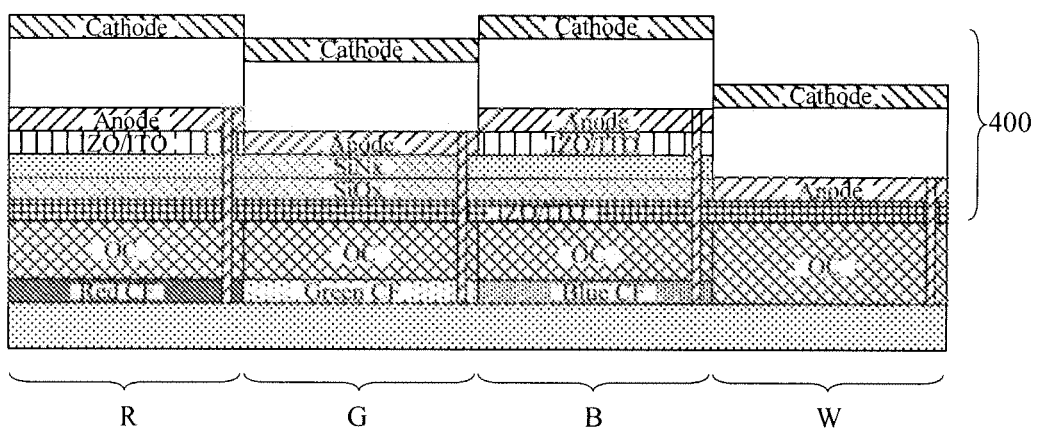
FIG. 3 shows a diagram of another WOLED array substrate structure with microcavity structure of conventional technology.
Figure 4:
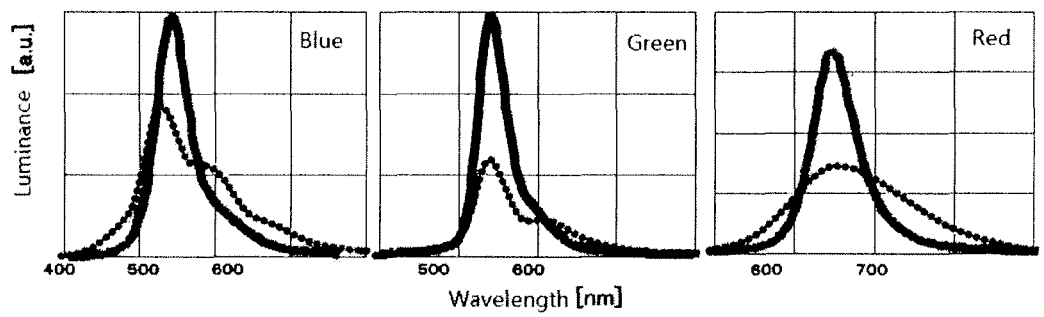
FIG. 4 shows a graph of increase in transmittance by the microcavity structure.
Figure 5:
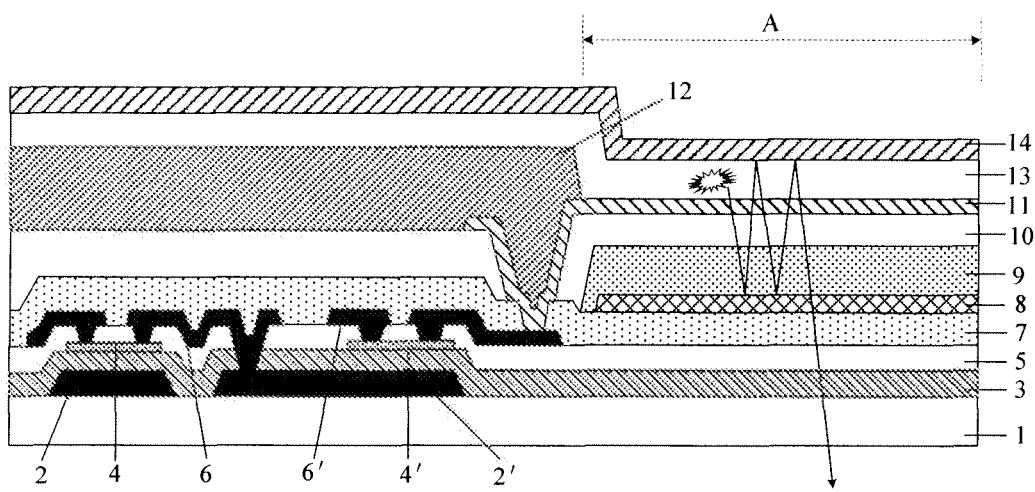
FIG. 5 is a diagram of an array substrate structure according to an embodiment of the present invention.

As illustrated in FIG. 5, an array substrate according to the present embodiment comprises: a plurality of gate lines, data lines, and pixel units defined by the gate lines and the data lines, formed on a base substrate 1. Each of the pixel unit comprises: a thin film transistor structure formed on the base substrate 1 and an OLED driven by the thin film transistor structure, the OLED located in a pixel region of the pixel unit (often referring to a display region outside the thin film transistor), that is, A region in FIG. 5 (the region outside the A region is the thin film transistor region). The pixel unit also includes a color filter 9. The OLED comprises in order in a direction away from the base substrate 1, a first electrode 11 which is transparent, a light-emitting layer 13 and a second electrode 14 for reflecting light.

To obtain a microcavity structure, the pixel unit of the array substrate according to the present embodiment further comprises a transflective layer 8. The transflective layer 8 is located between the OLED and the passivation layer, the color filter 9 is located between the second electrode 14 of the OLED and the transflective layer 8, and color filters 9 of different colors have different thicknesses. The second electrode 14 of the OLED and the transflective 8 form a microcavity structure, wherein the color filter 9 is located inside the microcavity structure and between the second electrode 14 of the OLED and the transflective layer 8. Therefore, it is possible to adjust the thickness of the microcavity structure through controlling the thickness of the color filter 9; since the color filters of the pixel units of different colors are to be formed in different steps, thicknesses thereof can be easily controlled respectively, without additionally forming other layers individually for a pixel unit of a certain color in order to control its thickness. Therefore, the array substrate according to embodiments of the present invention can be easily manufactured at low cost.

The thin film transistor structure, as shown in FIG. 5, comprises a first gate 2, a second gate 2' and gate lines (not illustrated) formed on the base substrate 1; a gate insulation layer 3 formed on the first gate 2, the second gate 2' and the gate lines; an first active layer 4 and a second active layer 4' formed on the gate insulation layer 3; an insulation layer 5 formed on the first active layer 4 and the second active layer 4'; a first source/drain layer 6 (including a first source and a first drain) and a second source drain layer 6' (including a second source and a second drain) formed on the insulation layer 5; and a passivation layer 7 formed on the first source drain layer 6 and the second source drain layer 6'; wherein the first gate 2, the gate insulation layer 3, the first active layer 4, the insulation layer 5 and the first source/drain layer 6 constitute a switching thin film transistor, and the second gate 2', the gate insulation layer 3, the second active layer 4', the insulation layer 5 and the second source/drain 6' constitute a driving thin film transistor.

In the present embodiment, a transflective layer 8 is formed over the passivation layer 7 and a color filter 9 is formed over the transflective layer 8. The OLED is disposed over the transflective layer 8 and the color filter 9 and is formed in pixel region A through a pixel define layer (PDL). In the present embodiment, the first electrode 11 is an anode, the second electrode 14 is a cathode (or, the first electrode 11 is a cathode and the second electrode 14 is an anode) and the first electrode 11 is connected to the second drain through a via hole in the passivation layer 7. The second electrode 14 can be a reflective electrode made of a reflective material. The second electrode 14 can be coated with a reflective layer in order to form a reflective electrode.

The gate (the first gate 2) of the switching thin film transistor is connected to the gate lines, the source (the first source) of the switching thin film transistor is connected to the data lines, the drain (the first drain) of the switching thin film transistor is connected to the gate (the second gate 2') of the driving thin film transistor, the source (the second source) of the driving thin film transistor is connected to a power voltage, the drain (the second drain) of the driving thin film transistor is connected to the first electrode 11 of the OLED. White light emitted by the white organic light-emitting layer 13 exits from bottom of the base substrate 1 after passing through the first electrode 11 and the underlying layers, as illustrated in FIG. 5. When the white light is incident on the transflective layer 8, a portion of the light exits, the other portion of the light is reflected, the reflected light is reflected again by the second electrode 14. Thus, the light is continuously reflected on the transflective layer 8 and on the second electrode 14, and finally, in the light exiting from the transflective layer 8, light with corresponding wavelength will be intensified due to the resonant effect, therefore, the transmittance is increased.

To increase the spatial distance of the microcavity structure and further increase the transmittance, a resin layer 10 is formed between the color filter 9 and the anode 11, and the first electrode 11 is connected to the second drain by a via hole through the passivation 7 and the resin layer 10.

In the present embodiment, the transflective layer 8 has a transmittance in a range of 5% to 95%, and is made of any one of silver, aluminium, molybdenum, copper, titanium, chromium and alloys thereof. The transflective layer 8 has a thickness in a range of 10 Å to 200 Å. The color filter 9 has a thickness in a range of 1000 Å to 40000 Å and can be a color filter of RGB mode, RGBY mode or RGBW mode.

Figure 6:
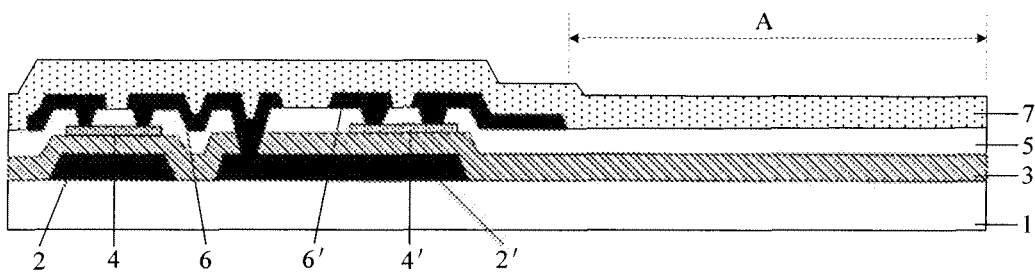
FIG. 6 is a diagram of forming a thin film transistor structure on a base substrate in a process flow of manufacturing the array substrate in FIG. 5.

Embodiments of the present invention also provide a method of making the array substrate mentioned above, the method comprises:

Step S1: forming patterns of a thin film transistor structure and a passivation layer 7 on a base substrate 1 and defining a plurality of pixel units on the base substrate 1. The step forms corresponding layers (by coating, spluttering, depositing and etc.), and then forms corresponding patterns of the layers through patterning processes (which may comprise photoresist coating, exposing, developing, etching, photoresist peeling and etc.), and it is substantially the same as conventional processes for manufacturing an array substrate, and it will not be elaborated here. The substrate formed after the step is shown in FIG. 6. FIG. 6 shows a structure of a pixel unit in which a region where the thin film transistor is located is a non-pixel region and the pixel region is designated by A. The thin film transistor structure comprises a switching thin film transistor and a driving thin film transistor, wherein the switching thin film transistor is constituted of the first gate 2, the gate insulation layer 3, the first active layer 4, the insulation layer 5 and the first source/drain layer 6 (including the layer of the first source and the first drain); the driving thin film transistor is constituted of the second gate 2', the gate insulation layer 3, the second active layer 4', the insulation layer 5 and the second source/drain layer 6' (including the layer of the second source and the second drain).

Figure 7:
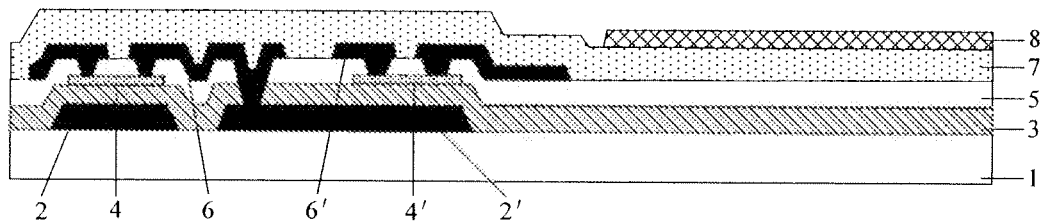
FIG. 7 is a diagram of forming a pattern of a transflective layer on the basis of the structure in FIG. 6.
Figure 8:
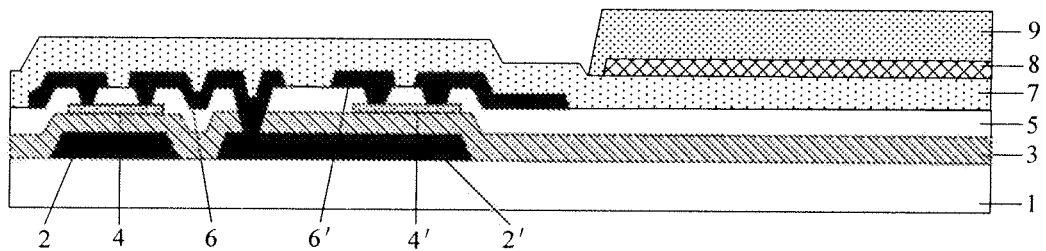
FIG. 8 is a structural diagram of forming a pattern of a color filter on the basis of the structure in FIG. 7.

Step S2: as shown in FIGS. 7 and 8, patterns of a transflective layer 8 and a color filter 9 are formed in the pixel region A of the pixel unit with the color filter located above the transflective layer 8 and color filters 9 of different colors having different thicknesses. The step comprising:

A transflective film is formed on the passivation layer 7. The transflective film is made of any one of silver, aluminum, molybdenum, copper, titanium, chromium and alloys thereof and has a thickness in a range of 10 Å-200 Å and a transmittance in a range of 5%-95%. A pattern of the transflective layer 8 is formed in the pixel region A through a patterning process after the transflective film is formed.

Formation of the color filter 9 is completed in a plurality of processes steps (3 processes for RGB) with one process step for a color filter of one color. The pattern of the color filter 9 is formed by sequentially forming patterns of color filters of different colors. The color filters 9 is formed by: forming a color filter film of one color on the transflective layer 8 and forming a pattern of a filter for this color on the pixel region A by a patterning process. Patterns of the filters of other colors are formed sequentially in this manner, to form patterns of the color filters 9, and when patterns of the filters for each color are formed, the color filter films of each color formed have different thicknesses, so that color filters of different colors of the color filter 9 finally formed have different thicknesses. The color filters 9 finally formed have a thickness in a range of 1000 Å-40000 Å; the reason that the color filters have a wide thickness range is the color filter is provided in the microcavity structure and thus thickness of the microcavity structure can be controlled through adjusting the thickness of the color filters, so that microcavity structure in each pixel unit enhances light of the same color as that of the color filter 9. Since color filters of the pixel units of different colors are formed in different steps with their thicknesses to be controlled separately and without requiring to form additional and individual other layers for pixels of a certain color to control its thickness, therefore, the array substrate according to the present invention can be easily manufactured at a low cost.

Figure 9:
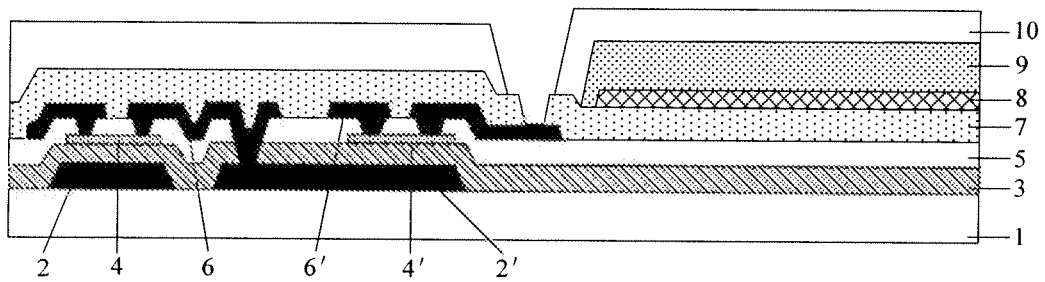
FIG. 9 is a structural diagram of forming a pattern of a resin layer on the basis of the structure in FIG. 8.

Step S3: forming an OLED in the pixel region A of the pixel unit, such that the transflective layer 8 and the color filters 9 are disposed between the OLED and the thin film transistor structure. This step comprises the following:

Etching via holes in the passivation layer 7 through a patterning process, as shown in FIG. 9. To increase the spatial distance of the microcavity structure and further increase transmittance, it is also possible to form a resin layer 10 on the passivation layer 7, and the via holes penetrate through the passivation layer 7 and the resin layer 10.

Figure 10:
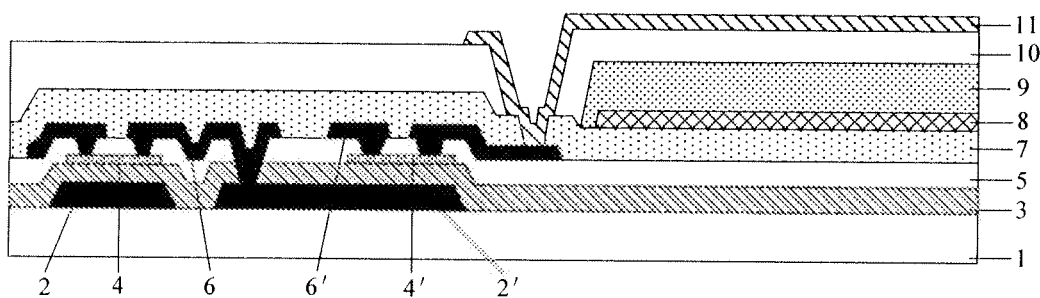
FIG. 10 is a structural diagram of forming an anode on the basis of the structure in FIG. 9.

Forming a transparent conductive film, as shown in FIG. 10. A pattern of the first electrode 11 of the OLED is formed through a patterning process, so that the first electrode 11 is connected to the thin film transistor structure through the via holes, and specifically connected to the drain of the driving thin film transistor.

Figure 11:
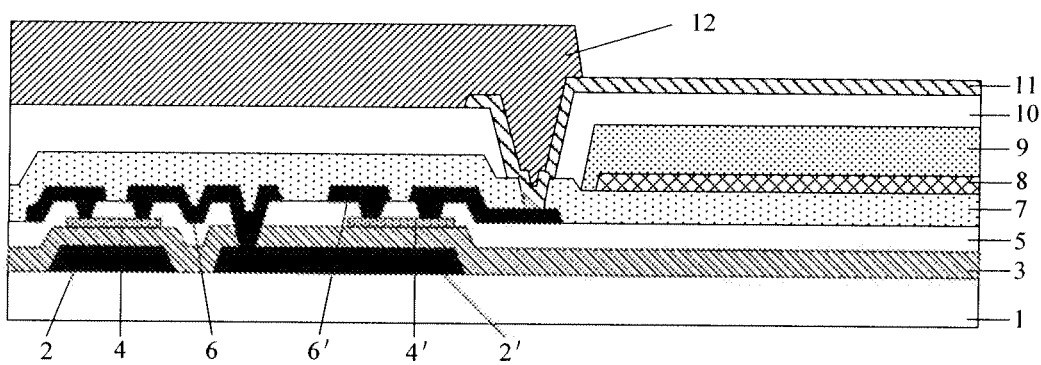
FIG. 11 is a structural diagram of forming a pattern of a pixel defining layer on the basis of the structure in FIG. 10.

Forming an insulation film, as shown in FIG. 11. A pattern of the pixel define layer 12 is formed through a patterning process, so that position of an OLED to be formed is defined in the pixel region A.

Forming an organic light-emitting layer 13 and a second electrode 14 of the OLED, so that the OLED is formed. The array substrate finally formed is shown in FIG. 5. The second electrode 14 is a reflective electrode, and can be made of a reflective material. Or, a reflective layer is formed prior to the second electrode 14 is formed and then the second electrode 14 is formed on the reflective layer. Or, the second electrode 14 is formed and then a reflective layer is formed on the second electrode 14.

Embodiments of the present invention also provide a display device comprising the above said array substrate. The display device may be any product or component having a display function, such as an electronic paper, an OLED panel, and OLED display, an OLED TV, a digital photo frame, a mobile, a laptop and the like.

The foregoing are merely exemplary embodiments of the invention, but are not used to limit the protection scope of the invention. The protection scope of the invention shall be defined by the attached claims.

The invention claimed is:

1. An array substrate comprising a base substrate and a plurality of pixel units disposed on the base substrate, each of the pixel units comprising:
   a thin film transistor structure formed on the base substrate; and
   an OLED driven by the thin film transistor structure, the OLED disposed in the pixel region of the pixel units, the OLED sequentially including a first electrode which is transparent, a organic light-emitting layer and a second electrode in a direction away from the base substrate, the second electrode used for reflecting lights;
   a transflective layer disposed between the OLED and the thin film transistor structure;
   a color filter disposed between the second electrode of the OLED and the transflective layer;
   wherein the second electrode of the OLED and the transflective layer constitute a microcavity structure; and
   wherein the transflective layer is separate and non-electrically connected with the first electrode.

2. The array substrate according to claim 1, wherein, the thin film transistor structure comprises a first gate and a second gate formed on the base substrate, a gate insulation layer formed over the first gate and the second gate, a first active layer and a second active layer formed on the gate insulation layer, a first source and a first drain formed on the first active layer, a second source and a second drain formed on the second active layer, the first drain being connected to the second gate, the first gate, the gate insulation layer, the first active layer, the first source and the first drain constituting a switching thin film transistor, the second gate, the gate insulation layer, the second active layer, the second source and the second drain constituting a driving thin film transistor;
   the second drain of the driving thin film transistor and the first electrode of the OLED are electrically connected.

3. The array substrate according to claim 2, wherein, a passivation layer is formed on the thin film transistor structure; the OLED is formed over the passivation layer with the first electrode connected to the second drain through via holes in the passivation layer, the transflective layer formed over the passivation layer, the color filter formed over the transflective layer, color filters of different colors having different thicknesses, both the transflective layer and the color filter disposed in the pixel region of the pixel units, and the anode of the OLED located above the color filter.

4. The array substrate according to claim 3, further comprising a resin layer disposed between the color filter and the first electrode, the first electrode being connected to the second drain by via holes through the resin layer and the passivation layer.

5. The array substrate according to claim 1, further comprising a pixel define layer disposed in a region corresponding to the thin film transistor structure of the pixel units and above the first electrode.

6. The array substrate according to claim 1, wherein the transflective layer is made of any one of silver, aluminum, molybdenum, copper, titanium, chromium and alloys thereof and has a transmittance in a range of 5% to 95%.

7. The array substrate according to claim 1, wherein the transflective layer has a thickness in a range of 10 Å to 200 Å.

8. The array substrate according to claim 1, wherein the color filter has a thickness in a range of 1000 Å to 40000 Å.

9. The array substrate according claim 1, wherein, the color filter is a color filter of RGB mode, RGBY mode or RGBW mode.

10. A display device including the array substrate according to claim 1.

11. A method for manufacturing an array substrate, the method comprising following steps:
   forming patterns of a thin film transistor structure and a passivation layer on a base substrate to define a plurality of pixel units on the base substrate;
   forming patterns of the transflective layer and the color filter in a pixel region of the pixel units such that the color filter is disposed above the transflective layer; and
   forming an OLED in the pixel region of the pixel units so that the transflective layer and the color filter are disposed between a second electrode of the OLED and the thin film transistor structure;
   wherein the thin film transistor structure comprises a first gate and a second gate formed on the base substrate, a gate insulation layer formed over the first gate and the second gate, a first active layer and a second active layer formed on the gate insulation layer, a first source and a first drain formed on the first active layer, a second source and a second drain formed on the second active layer, the first drain being connected to the second gate, the first gate, the gate insulation layer, the first active layer, the first source and the first drain constituting a switching thin film transistor, the second gate, the gate insulation layer, the second active layer, the second source and the second drain constituting a driving thin film transistor;
      the second drain of the driving thin film transistor and the first electrode of the OLED are electrically connected; and
      wherein the transflective layer is separate and non-electrically connected with the first electrode.

12. The method according to claim 11, wherein, forming patterns of the transflective layer and the color filter in the pixel region of the pixel units comprising:
   forming a transflective film on the passivation layer and forming patterns of the transflective layer in the pixel region through a patterning process;
   forming a color filter film of one color on the base substrate formed with the transflective layer, forming a pattern of the color filter in the pixel region through a patterning process and forming patterns of color filters of other color sequentially in this manner so that patterns of the color filters are formed and the color filters of different colors has different thicknesses.

13. The method according to claim 11, wherein, forming the OLED in the pixel region of the pixel units comprises:
   etching via holes in the passivation layer through a patterning process;
   forming a transparent conductive film and forming a pattern of the first electrode of the OLED through a patterning process so that the first electrode is connected to the thin film transistor structure through the via holes;
   forming an insulation film and forming a pattern of the pixel define layer through a patterning process so that position of the OLED to be formed is defined in the pixel region;
   forming an organic light-emitting layer; and
   forming a second electrode of the OLED for reflecting light to form the OLED.

14. The method according to claim 11, wherein the method further comprises forming a resin layer after patterning the transflective layer and the color filter and before forming the OLED.

15. The method according to claim 14, wherein, forming the OLED in the pixel region of the pixel units comprises:
   forming via holes through the resin layer and the passivation layer by a patterning process;
   forming a transparent conductive film, and forming patterns of the first electrode of the OLED through a patterning process so that the first electrode is connected to the thin film transistor structure through via holes;
   forming an insulation film, and patterning patterns of the pixel define layer through a patterning process so that position of the OLED to be formed is defined in the pixel region;
   forming an OLED; and
   forming a second electrode of the OLED and thus forming the OLED, the second electrode used for reflecting light.

16. The method according to claim 11, wherein the transflective layer is made of any one of silver, aluminum, molybdenum, copper, titanium, chromium, and alloys thereof and has a transmittance in a range of 5% to 95%.

17. The method according to claim 11, wherein the transflective layer has a thickness in a range of 10 Å to 200 Å.

18. The method according to claim 11, wherein the color filter has a thickness in a range of 1000 Å to 40000 Å.

* * * * *